United States Patent [19]

Chen et al.

[11] Patent Number: 5,157,734
[45] Date of Patent: Oct. 20, 1992

[54] METHOD AND APPARATUS FOR PICKING AND PLACING A SURFACE MOUNTED DEVICE WITH THE AID OF MACHINE VISION

[75] Inventors: Inn-Ming Chen; Yeu-Hwa Shyy; Jeng-Chang Yeh; Yunghsueh Chao, all of Hsin Chu, Taiwan

[73] Assignee: Industrial Technology Research Institute, Hsin Chu Hsien, Taiwan

[21] Appl. No.: 452,395

[22] Filed: Dec. 19, 1989

[51] Int. Cl.$^5$ .............................................. G06K 9/00
[52] U.S. Cl. ............................................ 382/8; 382/44; 358/107
[58] Field of Search .............. 382/8, 44; 358/107, 358/101; 318/568.19

[56] References Cited

U.S. PATENT DOCUMENTS

| | | | |
|---|---|---|---|
| 4,017,721 | 4/1977 | Michaud | 235/151.3 |
| 4,494,139 | 1/1985 | Shima et al. | 358/101 |
| 4,737,845 | 4/1988 | Susuki et al. | 358/101 |
| 4,847,911 | 7/1989 | Morimoto et al. | 358/101 |

FOREIGN PATENT DOCUMENTS

| | | | |
|---|---|---|---|
| 0151417 | 8/1985 | European Pat. Off. | 318/568.19 |
| 63-104105 | 5/1988 | Japan | 318/568.19 |

Primary Examiner—Leo H. Boudreau
Assistant Examiner—Barry Stellrecht
Attorney, Agent, or Firm—Cushman, Darby & Cushman

[57] ABSTRACT

A method for accurately placing a surface mounting device (SMD) with a vacuum nozzle analyzes a video image of the SMD to locate the SMD leads and compute corrections. The positions of the lead centers are processed to determine the translation and rotation of the SMD relative to a desired location. The position of the SMD centroid is transformed from an image-referenced coordinate system to a space-referenced coordinate system. The SMD rotation relative to a desired orientation is derived from the slope of a line drawn through colinear SMD leads.

4 Claims, 8 Drawing Sheets

METHOD AND APPARATUS FOR PICKING AND PLACING A SURFACE MOUNTED DEVICE WITH THE AID OF MACHINE VISION

BACKGROUND OF THE INVENTION

The invention relates to a method and apparatus for accurately placing a surface mounting device (SMD) on predetermined pads of a printed circuit board with the aid of machine vision.

Conventional pick-and-place machines carry surface mount devices with a vacuum nozzle. Displacement and rotation errors in the position and the orientation of the SMD relative to the nozzle limit positioning accuracy. That is to say, if the SMD is misaligned with the nozzle, and the pick-and-place machine places the nozzle in a desired nozzle position, the SMD will be misaligned with the desired SMD position. Use of different nozzles for different SMD sizes improves accuracy but sacrifices system flexibility. The number of fixtures required will increase with the increase in sizes of SMDs. The frequency of replacing fixtures will also increase, system efficiency will decrease, costs will rise and maintenance will be more difficult. Moreover, such nozzles orient the SMD body rather than the leads. Offset between the center line of an SMD body and the center line of the leads may be as large as seven mil (1 mil=1/1000 in.) therefore, use of different fixtures provides only limited improvement in accuracy.

SUMMARY OF THE INVENTION

30 The invention provides a method and apparatus for picking and placing accurately a surface mounting device (SMD) at a predetermined position, such as on a printed circuit board, with the aid of machine vision. The method includes the following steps:

a) moving a suction nozzle with an SMD attached to a predetermined nozzle position in front of a camera, and taking an image of the SMD leads;

b) moving the SMD nozzle toward a predetermined nozzle position near a printed circuit board;

c) analyzing the image of the leads in order to determine errors in the displacement and rotation of the SMD relative to the nozzle; and d) correcting the displacement and rotation of the nozzle so as to accurately place the SMD on the printed circuit board.

Image analysis includes the following steps:

i) determining the position of the center of each lead in the coordinate frame of the camera image (referred to as the image coordinate system);

ii) calculating the center of the leads (referred to as the centroid of the SMD) in the coordinate frame of the camera image (referred to as an image coordinate system);

iii) transforming the position of the centroid from the image coordinate system to a coordinate system referenced to the nozzle (referred to as a space coordinate system);

iv) determining the displacement error of the SMD relative to the nozzle in the space coordinate system;

v) determining the rotational orientation of the SMD relative to the nozzle in the image coordinate system;

vi) determining the rotational error to be corrected in the space coordinate system.

An apparatus for picking and placing an SMD in accordance with the invention includes:

1) a nozzle having degrees of freedom for displacement and rotation which can carry an SMD and be placed at a predetermined nozzle position;

2) a camera for taking images of the leads of the SMD carried by the nozzle;

3) a lighting source for uniformly illuminating the leads of an SMD to aid the camera in acquiring a high quality image;

4) an image processing unit, which includes a frame grabber for processing camera images and calculating position and rotation corrections so that the SMD may be accurately placed; and 5) a control unit for coordinating the operation of the pick-and-place device, camera, and image processing unit to accurately place an SMD.

BRIEF DESCRIPTION OF THE DRAWINGS

This invention can be more fully understood by referring to the following description together with the drawings in which.

DETAILED DESCRIPTION OF THE PREFERRED EMBODIMENT

Figure 1:
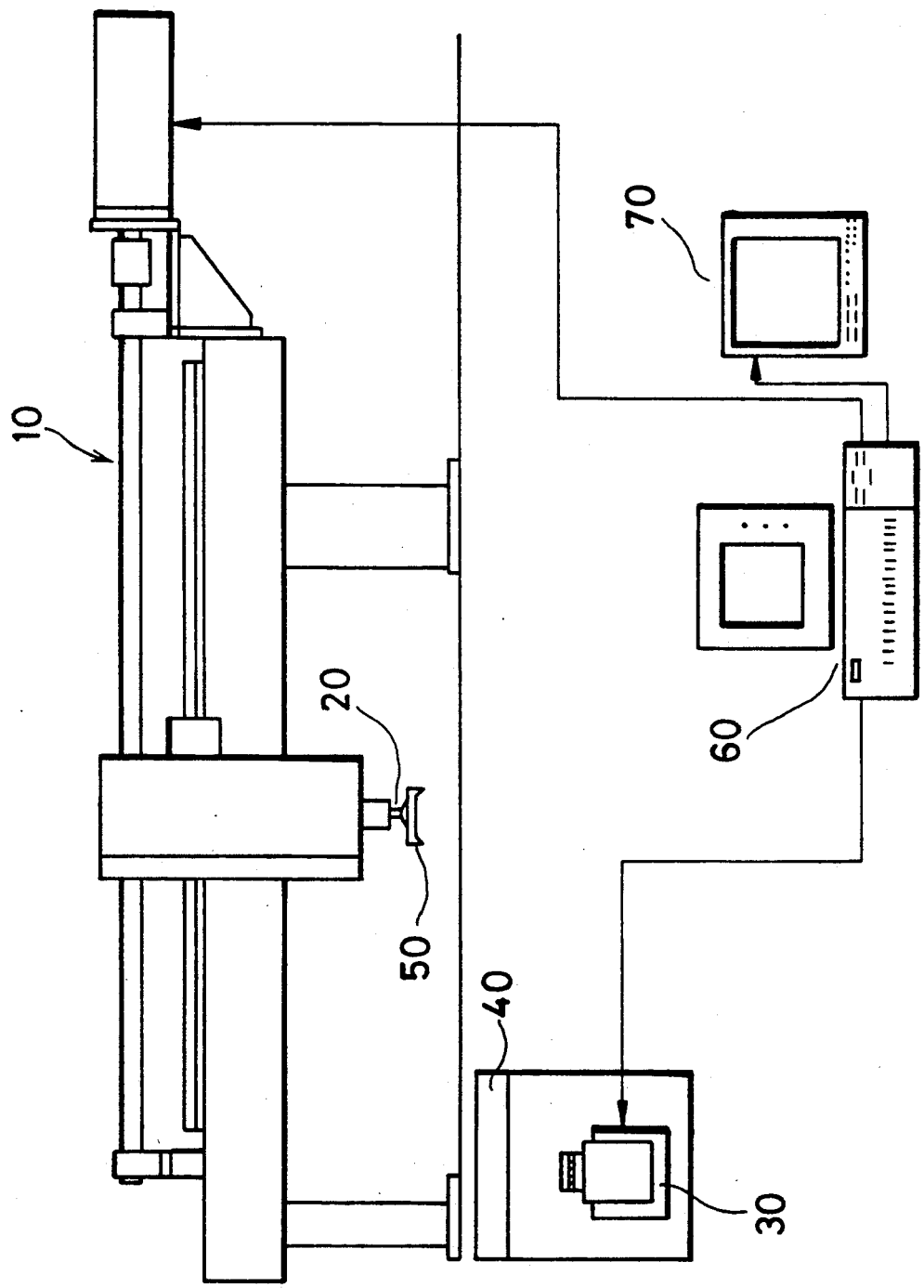
FIG. 1 is a diagram showing an apparatus in accordance with this invention.

The invention relates to an apparatus and method for placing a surface mounting device (SMD) in a predetermined position. FIG. 1 is a diagram of the preferred embodiment of an apparatus of the present invention. A pick-and-place device 10 has a vacuum nozzle 20 which holds and carries an SMD 50. The apparatus also includes a camera 30, a lighting source 40, an image processing unit 60, and a monitor 70. The nozzle 20 moves through three dimensions and rotates, thus carrying an SMD 50 to a desired position. When the nozzle 20 carries an SMD 50 in front of the camera 30, the camera 30 takes an image of the SMD leads. The lighting source 40 illuminates the SMD 50 so that the camera 30 takes a high quality image of the leads. The image processing unit 60 stores images in a frame grabber, controls the pick-and-place device and camera 30, and displays images on the monitor 70. The image processing unit 60 may also connect to an SMD feeding device and a printed circuit board holder (not shown) so as to control the feeding of SMDs and the positioning of printed circuit boards.

Figure 2:
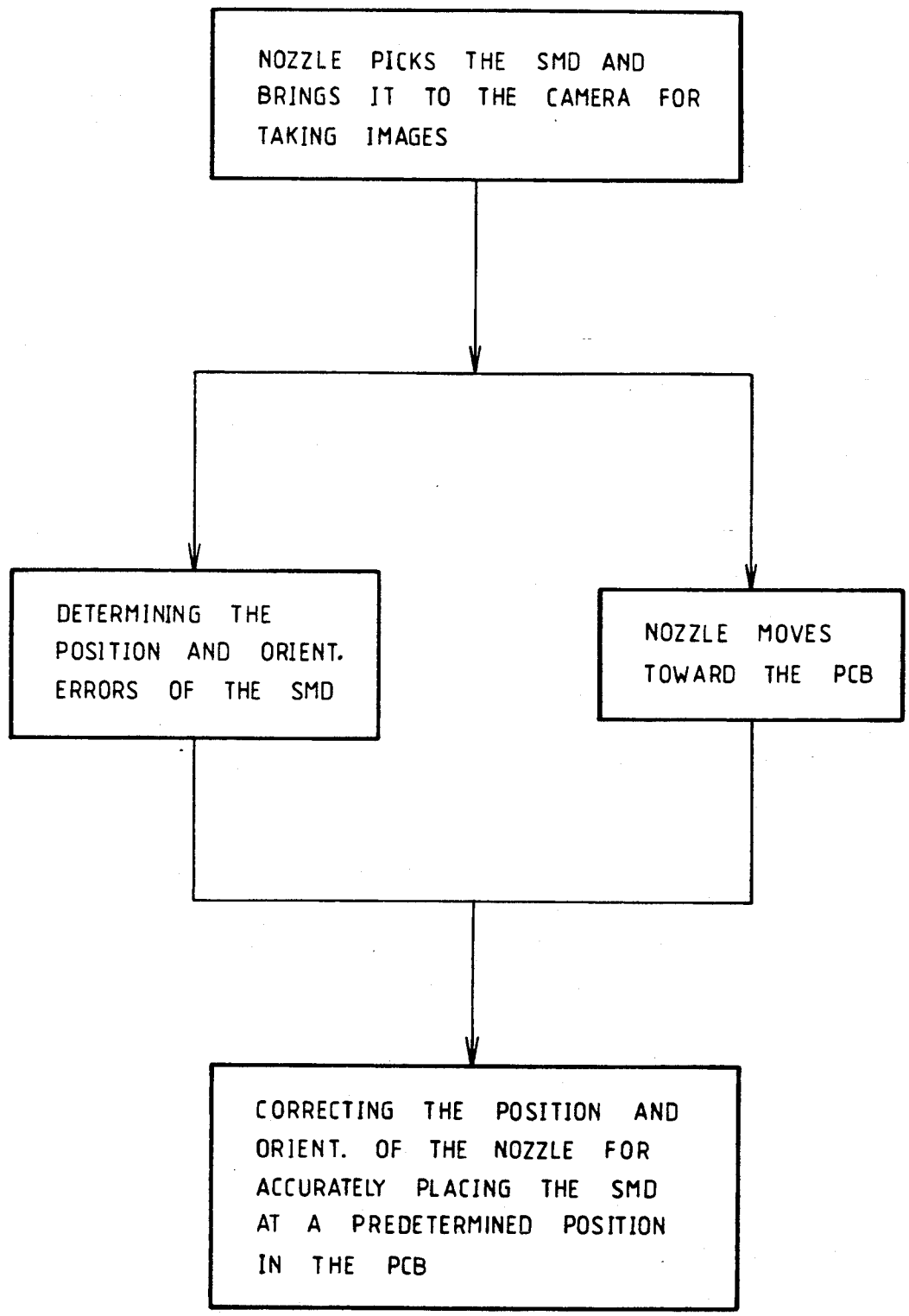
FIG. 2 is a flowchart showing a method in accordance with this invention.

The present invention also relates to a method for placing an SMD at a predetermined position, and FIG. 2 is a flow chart showing steps of such a method. The steps are summarized briefly here and discussed in more detail below. In an imaging step 101 a nozzle 20 or other device carries an SMD 50 to the camera 30, and the camera 30 takes an image of the SMD 50 leads. In an image processing step 103 the image processing unit 60 calculates the position and orientation of the leads and calculates error corrections which the nozzle 20 must make to accurately place the SMD 50. In a movement step 105 the nozzle 20 carries the SMD 50 to a predetermined position near the printed circuit board. In a placement step 107, the image processing unit 60 corrects the position and orientation of the nozzle 20 and accurately places the SMD 50 on the printed circuit board.

Figure 3:
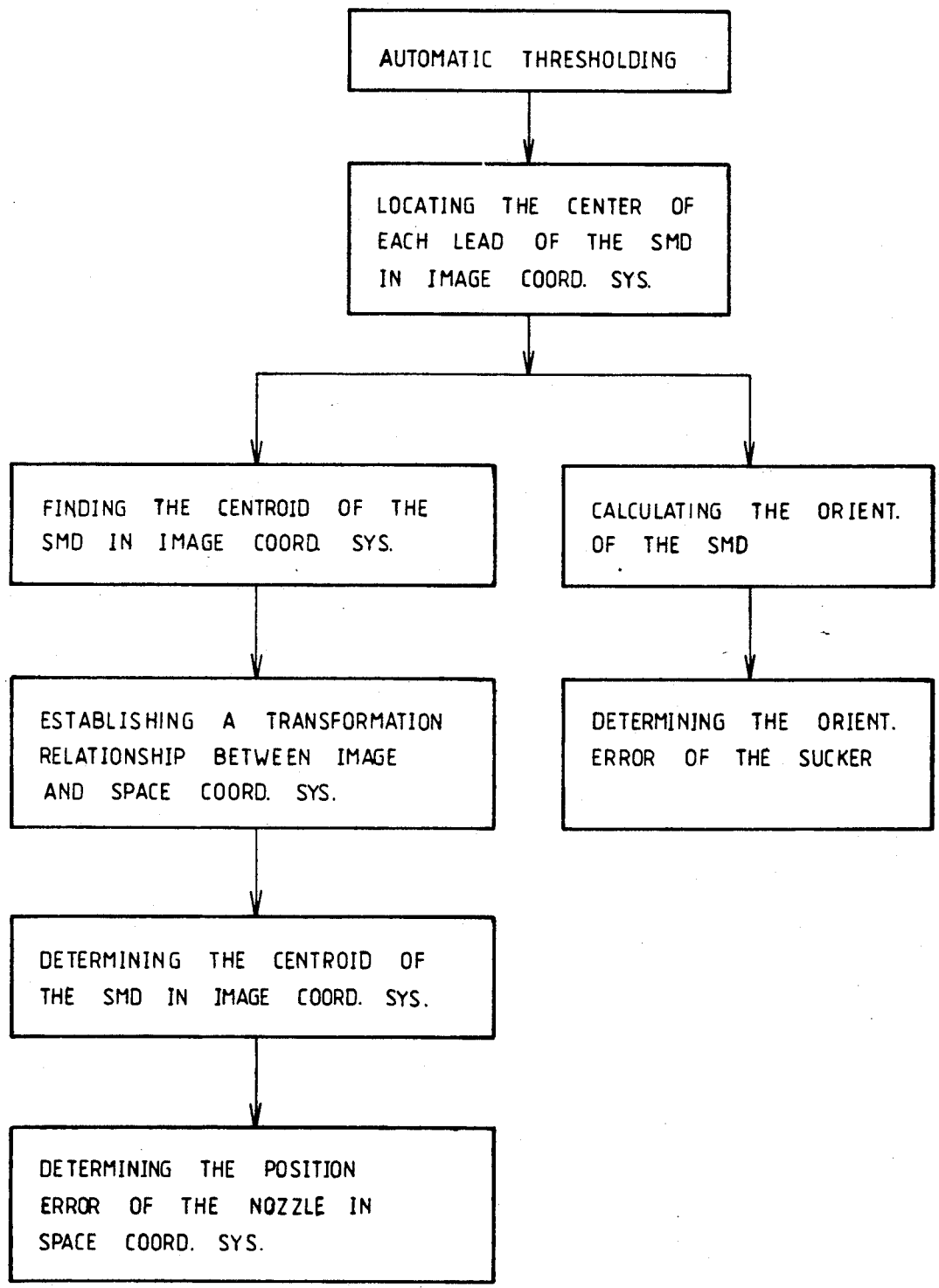
FIG. 3 is a flowchart showing steps for obtaining rotation and displacement errors of an SMD held by a pick-and-place device.

FIG. 3 is a flowchart showing details of the image processing step 103 of FIG. 2. The image processing unit 60 performs these steps on a frame of video data held in a frame grabber.

Figure 4:
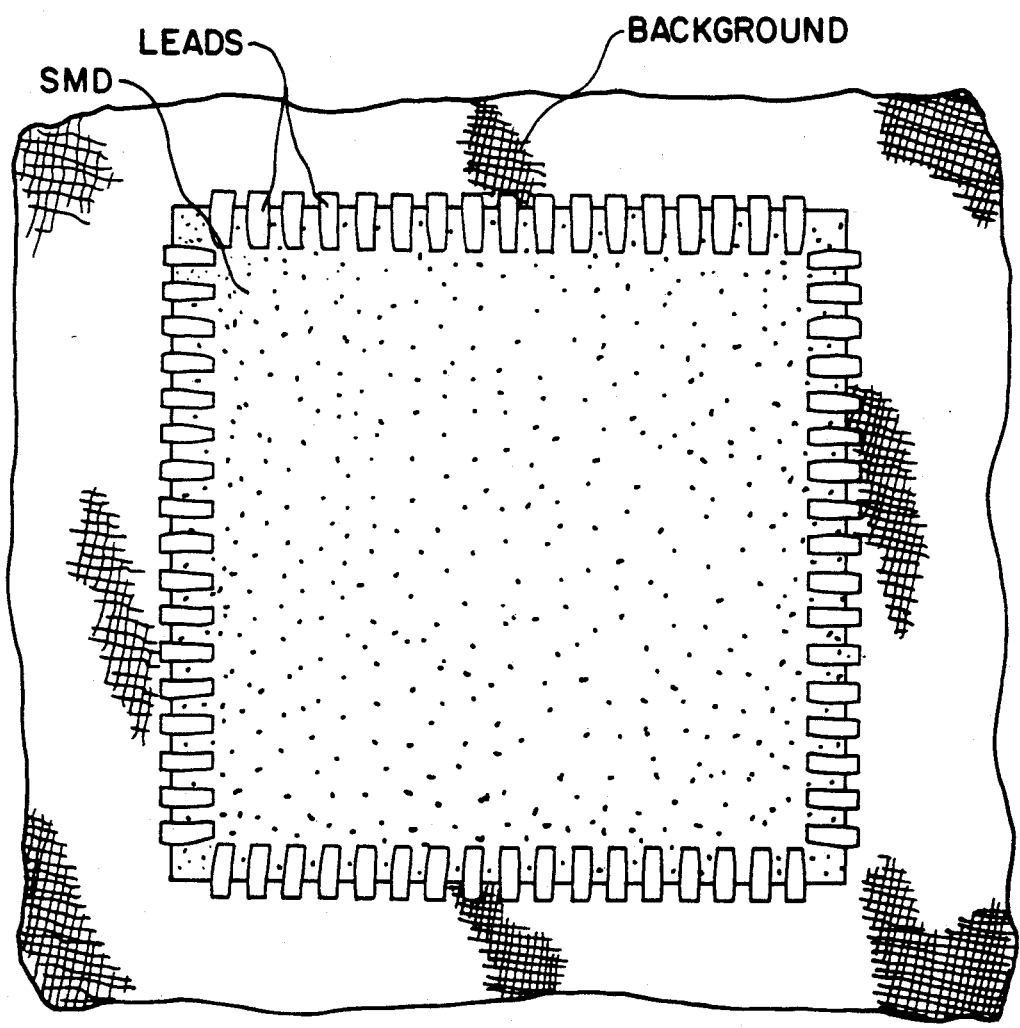
FIG. 4 a hard copy of a video image of an SMD including a group of leads.
Figure 5:
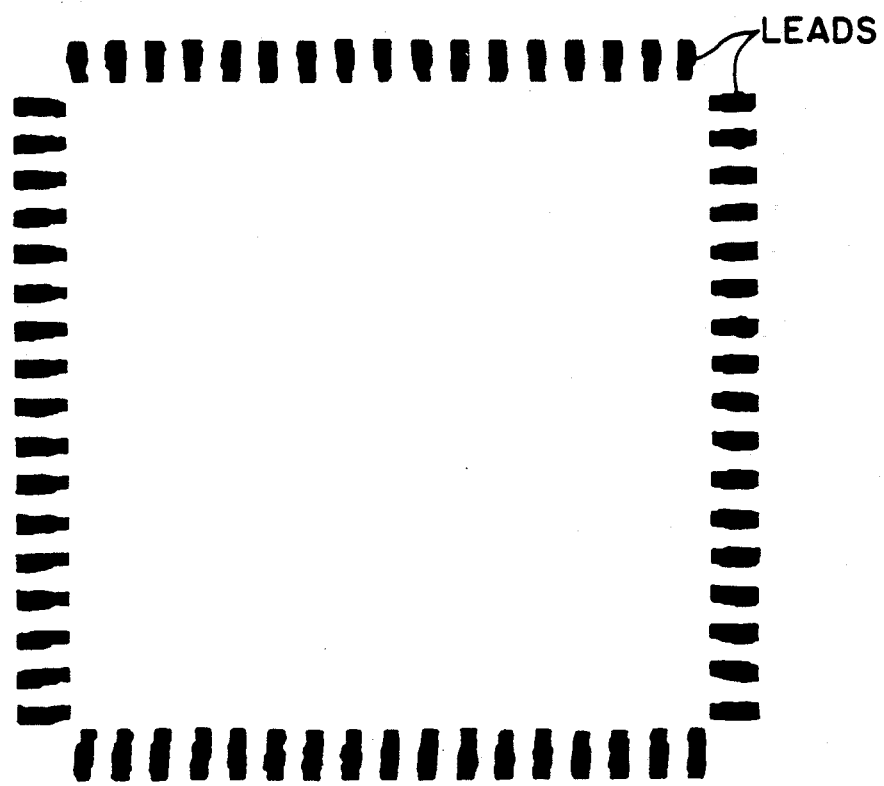
FIG. 5 is a hard copy of the video image from FIG. 4 after performing a threshold operation.

A thresholding step 111 distinguishes the SMD 50 from its background. The image processing unit 60 initially stores the SMD image as pixels which take on one of multiple levels of gray. The thresholding step 111 transforms the gray level image to a binary image. FIG. 4 is a hard copy of a gray level image of an SMD 50, and FIG. 5 is a hard copy of the same image after thresholding. Note that the areas of the leads of FIG. 4 appear as a black level in FIG. 5 whereas all other areas of FIG. 4 appear as a white level.

Figure 6:
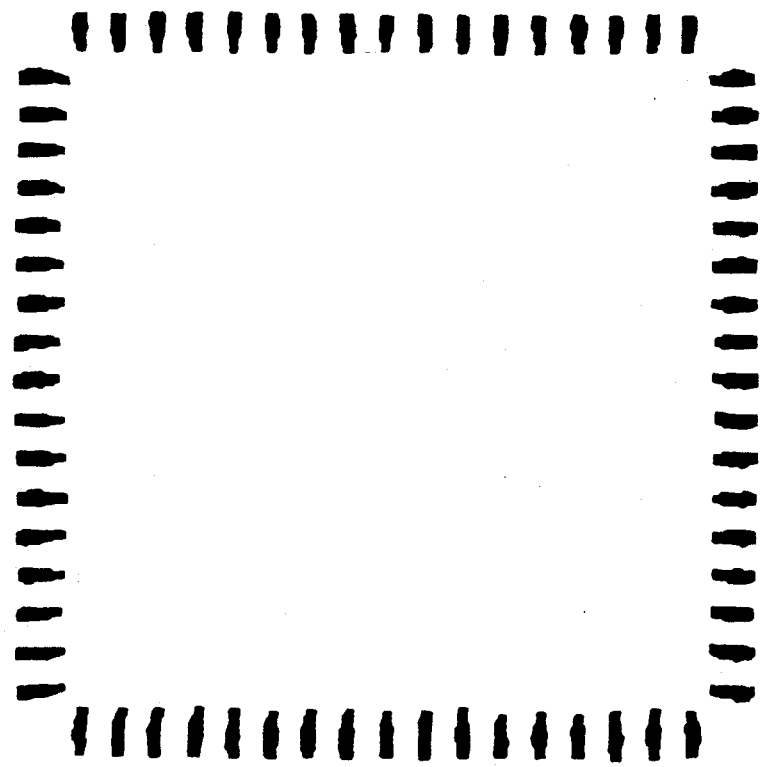
FIG. 6 is a hard copy of the video image from FIG. 5 after further processing by use of a contour tracing method.

In a lead locating step 113 of FIG. 3, the image processing unit 60 determines coordinates of the center of each lead. The image processing unit 60 uses a coordinate system defined by the camera field of view (image coordinate system). The image processing unit 60 first identifies points on the contours of each lead. FIG. 6 is a hard copy of the video image from FIG. 5 after further processing by use of a contour tracing method. The image processing unit 60 then identifies the geometric center of each lead. If the leads are centrally symmetric, the center is the arithmetic average of the coordinates of all points on the contour. If leads are non-symmetric, the center may be identified as follows:

1) defining a set of coordinates $(x_n, y_n)$ which are the contour points of the lead;
2) partitioning the set into pairs of points $(x_{m1}, y_m)$, $(x_{m2}, y_m)$ having the same y coordinate $y_m$. Note that $x_{m1}$ and $x_{m2}$ are the minimum and maximum contour points having the same value $y_m$ where $m=1, 2, \ldots, M_i$, and $M_i$ is the number of pairs for the lead;
3) for each pair of points, computing the following three values:

$$NO_m = X_{m2} - X_{m1} + 1$$

$$SX_m = NO_m * (X_{m2} + X_{m1})/2$$

$$SY_m = NO_m * Y_m$$

$NO_m$ is related to the number of pixel points on a segment between $(X_{m1}, Y_m)$ and $(X_{m2}, Y_m)$. $SX_m$ is related to the sum of the X values of the pixel points on a line segment between $(X_{m1}, Y_m)$ $(X_{m2}, Y_m)$. $SY_m$ is related to the sum of Y values of the pixel points on a line segment between $(X_{m1}, Y_m)$ and $(X_{m2}, Y_m)$. Note that there will be M, values for each of these quantities.

4) Calculate the image coordinate $[(X_c)_i]$ for the center of the lead as follows:

$$(X_c) = \sum_{m=1}^{M_i} SX_m / \sum_{m=1}^{M_i} NO_m$$

$$(Y_c) = \sum_{m=1}^{M_i} SY_m / \sum_{m=1}^{M_i} NO_m$$

Figure 7:
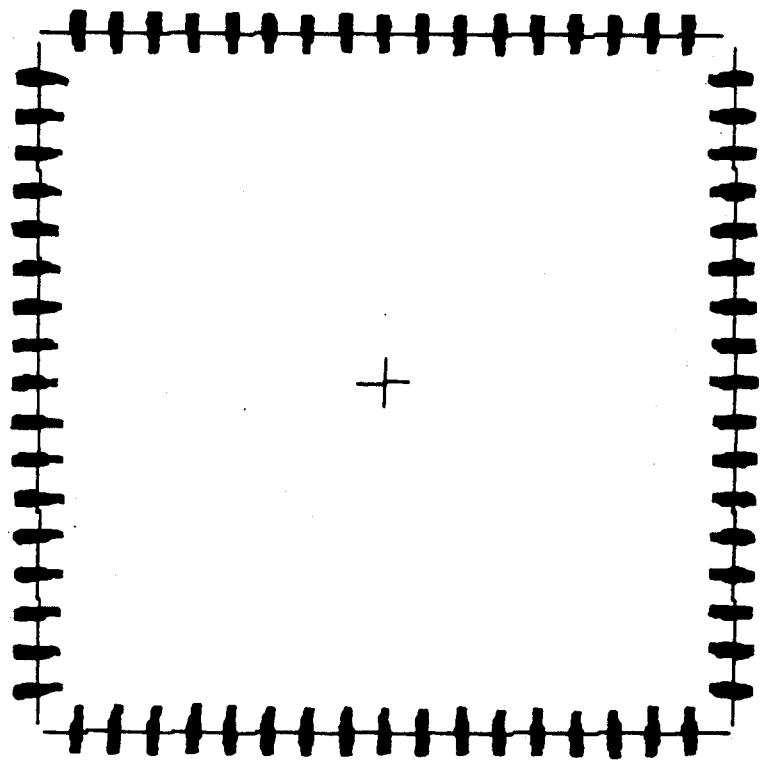
FIG. 7 is a hard copy of the video image from FIG. 6 additionally showing the centroid and rotation of the SMD.
Figure 8:
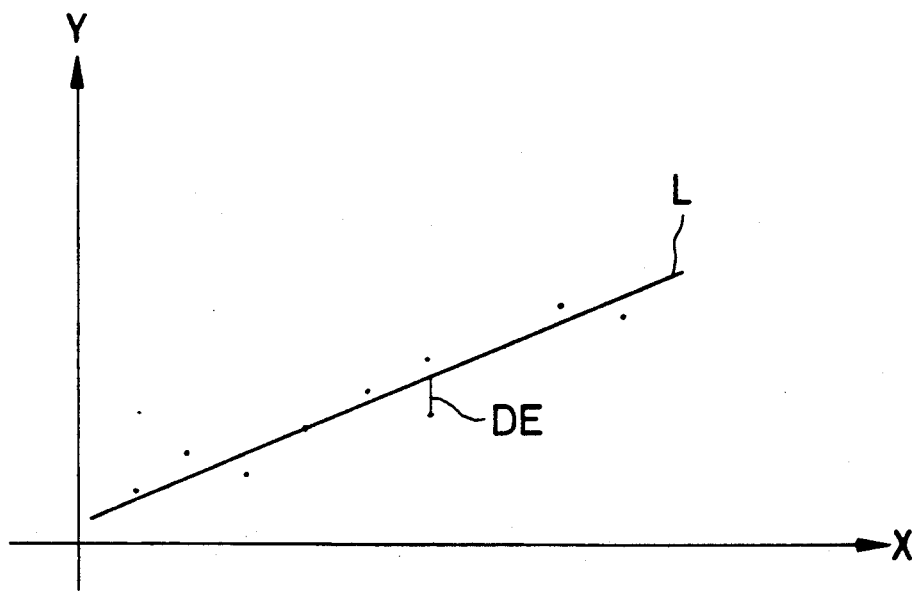
FIG. 8 is a graph of a straight line fitted to a set of points using a least square error fitting method.

In a centroid location step 115 of FIG. 3 the image processing unit 60 computes the coordinates of the SMD centroid. The centroid is the arithmetic average of the lead center coordinates. FIG. 7 is a hard copy of the processed image of FIG. 6 and additionally shows the centroid marked by a "+".

In a transformation step 119 of FIG. 3, the image processing unit 60 converts the centroid coordinates in the image coordinate system to centroid coordinates in a coordinate system referenced to the nozzle 20 (space coordinate system). In order to properly position the SMD 50, the image processing unit 60 must convert errors detected in the image to displacements and rotations of the nozzle 20. The camera lens, sensors and A/D convertors cause non-linear distortions between camera images and actual nozzle position in space. A transformation relates positions in the image coordinate system to positions in the space coordinate system. The transformation can be established by moving the nozzle 20 to a known space coordinate and recording the nozzle's position in the image space coordinates. Repeated recordings establish a number of points in the transform, and the relationship of other points can be calculated by interpolation.

In an error determination step 121 of FIG. 3, the image processing unit 60 computes the displacement error between the position of the SMD leads as observed (and transformed into space coordinates) and a desired position of the SMD 50 in the space coordinate system. This error is then the displacement correction which the nozzle 20 must make in order to properly position the SMD 50.

In an orientation calculating step 123 of FIG. 3, the image processing unit 60 determines the rotational orientation of the SMD 50 relative to the nozzle 20. The image processing unit 60 first transforms SMD lead coordinates from a rectangular coordinate system to a polar coordinate system having an origin at the SMD centroid. The image processing unit 60 then sorts the lead coordinates in a clockwise or counterclockwise direction to establish an ordered series of lead coordinates. The image processing unit 60 partitions the ordered set of leads into co-linear subgroups. That is to say, all the leads along one straight edge of an SMD 50 form a single subgroup, and there are separate subgroups for each SMD edge. The image processing unit 60 determines whether three lead centers are co-linear by evaluating a co-linearity error E defined as follow:

$$E = |(X_3 - X_2) - (X_2 - X_1)| + |(Y_3 - Y_2) - (Y_2 - Y_1)|$$

wherein $X_1, Y_1, X_2, Y_2, X_3$ and $Y_3$ are the coordinates of the three centroids in a rectilinear coordinate system.

Three points are co-linear if E is less than a threshold, but three points are not co-linear if E is greater than a threshold. For example, leads of a square SMD would be divided into four subgroups, each of which includes leads from one side of the square.

The image processing unit 60 computes the slope of an optimal straight line through each subgroup of lead centers. The algebraic expression for a straight line can be expressed as:

$$y = a + b(x - X) \text{ where } X = \Sigma X_n / N$$

The distance error DE between each point and the straight line along the x axis direction is:

$$DE = Y_n - Y$$

For a set of points in one subgroup, the sum of the square errors SSE is:

$$SSE = \sum_{n=1}^{N} (Y - Y_n)^2$$

$$SSE = \sum_{n=1}^{N} [a + b(x_n - x) - Y_n]^2$$

$$SSE = Na^2 + b^2 \sum_{n=1}^{N} (x_n - x)^2 + \sum_{n=1}^{N} Y_n^2 - 2a \sum_{n=1}^{N} Y_n -$$

$$2b \sum_{n=1}^{N} Y_n (Y_n - x) + 2ab \sum_{n=1}^{N} (x_n - x)$$

Note that $\sum_{n=1}^{N} (x_n - x) = 0$

In order to minimize SSE, the partial derivatives of SSE with respect to a and b must be zero, that is:

$$\frac{\partial (SSE)}{\partial a} = 0 \quad \frac{\partial (SSE)}{\partial b} = 0$$

By taking the partial derivative with respect to "b", the slope "b" can be derived:

$$\frac{\partial (SSE)}{\partial b} = -2b \sum_{n=1}^{N} (x_n - x)^2 - 2 \sum_{n=1}^{N} Y_n (x_n - x) = 0$$

$$b \sum_{n=1}^{N} (x_n - x)^2 = \sum_{n=1}^{N} Y_n (x_n - x)$$

$$b = \frac{\sum_{n=1}^{N} Y_n (x_n - x)}{\sum_{n=1}^{N} (x_n - x)^2}$$

By taking the partial derivative with respect to "a," the offset can be derived.

$$\frac{\partial (SSE)}{\partial a} = 2Na - 2 \sum_{n=1}^{N} Y_n = 0$$

$$Na = \sum_{n=1}^{N} Y_n$$

$$a = \frac{1}{N} \sum_{n=1}^{N} Y_n = y$$

The orientation of the SMD 50 is the arithmetic average of the slopes of two subgroups of leads from opposites sides of the SMD 50. The image processing unit 60 can calculate these slopes from the lead center coordinates using the equation for "b" above.

The SMD rotation error is the difference between an expected orientation and the orientation calculated from the image. The expected orientation (with respect to the nozzle 20) is one which results in a properly placed SMD 50 when the nozzle 20 moves to insert the SMD 50 in a printed circuit board (or other final position). The image processing unit 60 corrects the nozzle 20 by the amount of the orientation error.

The invention has been described with respect to a particular embodiment. The invention is not limited to the disclosed embodiment, but is intended to cover various modifications and equivalent arrangements included within the spirit and scope of the claims.

What is claimed is:

1. A method for placing, in a space coordinate system, a surface mounting device having a plurality of leads at a predetermined position comprising the steps of:

attaching the surface mounting device to a fixture;
   moving the fixture and the surface mounting device into the field of view of a camera;
   obtaining an image of the surface mounting device in an image coordinate system, the image of the surface mounting device comprising a plurality of lead images each corresponding to one of the leads;
   identifying the lead images in the image of the surface mounting device;
   calculating coordinates of points on the contour of each of the lead images;
   arithmetically the coordinates of points on the contour of each of the lead images weighing the determine coordinates of centroids of each of the lead images;
   grouping the centroids into a plurality of groups, each of the groups comprising any three of the centroids which are collinear with respect to each other;
   calculating, by a least square error method, calculations to determine an optimal straight line $Y = a + b(X - \overline{X})$ through the three centroids in each of the groups;
   determining coordinates of the center of the image of the surface mounting device in accordance with the centroids of the lead images; and
   correcting translation and rotation errors of the surface mounting device in the space coordinate system in accordance with the center of the image of the surface mounting device and the optimal straight lines, respectively in the image coordinate system.

2. A method according to claim 1, wherein the grouping step includes the steps of:

depicting the coordinates of the centroids of each of the lead images in a polar coordinate system having a center proximate to the center of the image of the surface mounting device;
   acquiring the groups in one of a clockwise and counterclockwise sequence about the polar coordinate system;
   determining a value of collinearity of three successive lead images in the sequence; and
   grouping the three successive lead images in one of the groups if the value of collinearity is less than a predetermined threshold.

3. A method according to claim 2, wherein the value of collinearity is determined in accordance with the following equation:

$$E = |(X_3 - X_2) - (X_2 - X_1)| + |(Y_3 - Y_2) - (Y_2 - Y_1)|$$

wherein E is the value of collinearity and $X_1$, $Y_1$, $X_2$, $Y_2$, $X_3$ and $Y_3$ are the coordinates of the three centroids in a rectilinear coordinate system.

4. A method according to claim 1, wherein the calculating step further includes a step of calculating the slope b of each of the optimal straight lines by way of the following formula:

$$b = \frac{\sum_{n=1}^{N} Y_n (X_n - X)}{\sum_{n=1}^{N} (X_n - X)^2}.$$

* * * * *